US011569688B2

(12) United States Patent
Liu et al.

(10) Patent No.: US 11,569,688 B2
(45) Date of Patent: Jan. 31, 2023

(54) WIRELESS CHARGER AND CONTROL METHOD

(71) Applicant: HUAWEI TECHNOLOGIES CO., LTD., Guangdong (CN)

(72) Inventors: Qitang Liu, Shenzhen (CN); Xiaosheng Zeng, Shenzhen (CN); Shuangke Liu, Shenzhen (CN); Chengbin Ma, Shenzhen (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 37 days.

(21) Appl. No.: 17/105,120

(22) Filed: Nov. 25, 2020

(65) Prior Publication Data
US 2021/0083510 A1 Mar. 18, 2021

Related U.S. Application Data

(63) Continuation of application No. PCT/CN2019/085946, filed on May 8, 2019.

(30) Foreign Application Priority Data

May 31, 2018 (CN) .......................... 201810548622.6

(51) Int. Cl.
*H02J 50/12* (2016.01)
*H02J 50/80* (2016.01)
(Continued)

(52) U.S. Cl.
CPC .............. *H02J 50/12* (2016.02); *H02J 50/05* (2016.02); *H02J 50/10* (2016.02); *H02J 50/80* (2016.02);
(Continued)

(58) Field of Classification Search
CPC .. H02J 50/05; H02J 50/80; H02J 50/10; H02J 50/12; H03F 2200/423; H03F 2200/546; H04B 5/0037; H02M 3/015
See application file for complete search history.

(56) References Cited

U.S. PATENT DOCUMENTS 6,232,841 B1 5/2001 Bartlett et al.
7,009,455 B2 3/2006 Toncich et al.
(Continued)

FOREIGN PATENT DOCUMENTS

CA 2844062 C 3/2017
CN 102355032 A 2/2012
(Continued)

OTHER PUBLICATIONS

Shuangke Liu et al.,"A Novel Design Methodology for High-Efficiency Current-Mode and Voltage-Mode Class-E Power Amplifiers in Wireless Power Transfer systems",IEEE Transactions on Power Electronics, vol. 32, No. 6 Jun. 2017 ,total 10pages.
(Continued)

*Primary Examiner* — Jeffrey M Shin
(74) *Attorney, Agent, or Firm* — Womble Bond Dickinson (US) LLP

(57) ABSTRACT

This application provides a wireless charger and a control method. The wireless charger includes a class-E power amplifier and a tunable impedance circuit that is connected to an output end of the class-E power amplifier. The class-E power amplifier includes a switching transistor and a tunable capacitance circuit that is parallelly connected to the switching transistor. The wireless charger further includes a control unit, configured to obtain a constraint condition of the class-E power amplifier; determine N1 target equivalent load impedances of the class-E power amplifier based on the constraint condition; and adjust a capacitance value of the tunable capacitance circuit in the class-E power amplifier,
(Continued)

and adjust an impedance value of the tunable impedance circuit, to enable an equivalent load impedance of the class-E power amplifier to match one of the N1 target equivalent load impedances.

17 Claims, 9 Drawing Sheets

(51) Int. Cl.
  *H02J 50/05* (2016.01)
  *H03F 3/217* (2006.01)
  *H02J 50/10* (2016.01)
  *H02J 7/02* (2016.01)
(52) U.S. Cl.
  CPC ........... *H03F 3/2176* (2013.01); *H02J 7/02* (2013.01); *H03F 2200/423* (2013.01); *H03F 2200/546* (2013.01)

(56) References Cited

U.S. PATENT DOCUMENTS

| | | | |
|---|---|---|---|
| 7,202,734 | B1 | 4/2007 | Raab |
| 8,643,326 | B2 | 2/2014 | Campanella et al. |
| 9,236,771 | B2 | 1/2016 | Toncich et al. |
| 2004/0008082 | A1 | 1/2004 | Dow |
| 2012/0242284 | A1* | 9/2012 | Wheatley, III .......... H02J 50/12 320/108 |
| 2013/0033118 | A1 | 2/2013 | Karalis et al. |
| 2014/0266460 | A1 | 9/2014 | Nobbe et al. |
| 2017/0063157 | A1 | 3/2017 | Ahmed et al. |
| 2017/0302110 | A1 | 10/2017 | Riehl et al. |
| 2018/0090969 | A1 | 3/2018 | Yang et al. |

FOREIGN PATENT DOCUMENTS

| | | |
|---|---|---|
| CN | 104243721 A | 12/2014 |
| CN | 104868612 A | 8/2015 |
| CN | 104917473 A | 9/2015 |
| CN | 106549505 A | 3/2017 |
| CN | 206894365 U | 1/2018 |
| CN | 206894366 U | 1/2018 |
| WO | 0103288 A1 | 1/2001 |
| WO | 2009070730 A2 | 6/2009 |
| WO | 2015023899 A2 | 2/2015 |

OTHER PUBLICATIONS

Minfan Fu et al.,"A Cascaded Boost Buck Converter for High-Efficiency Wireless Power Transfer Systems", IEEE Transactions on Industrial Informatics, vol. 10, No. 3, Aug. 2014, total 9 pages.
Hung-Wei Chiu et al.,"A Dual-Mode Highly Efficient Class-E Stimulator Controlled by a Low-Q Class-E Power Amplifier Through Duty Cycle", IEEE Transactions on Biomedical Circuits and Systems, vol. 7, No. 3, Jun. 2013, total 13 pages.
Minfan Fu et al.,"Analysis and Tracking of Optimal Load in Wireless Power Transfer Systems", IEEE Transactions on Power Electronics, vol. 30, No. 7, Jul. 2015, total 12 pages.
Alanson P. Sample et al.,"Analysis, Experimental Results, and Range Adaptation of Magnetically Coupled Resonators for Wireless PowerTransfer", IEEE Transactions on Industrial Electronics, vol. 58, No. 2, Feb. 2011, total 11 pages.
Teck Chuan Beh et al.,"Automated Impedance Matching System for Robust Wireless Power Transfer via Magnetic Resonance Coupling", IEEE Transactions on Industrial Electronics, vol. 60, No. 9, Sep. 2013, total 10 pages.
Samer Aldhaher et al.,"Electronic Tuning of Misaligned Coils in Wireless Power Transfer Systems", IEEE Transactions on Power Electronics, vol. 29, No. 11, Nov. 2014, total 8 pages.
Alanson P. Sample et al.,"Enabling Seamless Wireless Power Delivery in Dynamic Environments", vol. 101, 0018-9219/$31.00, 2013 IEEE No. 6, Jun. 201, Proceedings of the IEEE, total 16 pages.
Aref Trigui et al.,"Inductive Power Transfer System With Self-Calibrated Primary Resonant Frequency", IEEE Transactions on Power Electronics, vol. 30, No. 11, Nov. 2015, total 10 pages.
W. X. Zhong et al.,"Maximum Energy Efficiency Tracking for Wireless Power Transfer Systems", IEEE Transactions on Power Electronics, vol. 30, No. 7, Jul. 2015, total 10 pages.
Samer Aldhaher et al.,"Wireless Power Transfer Using Class E Inverter with Saturable DC-Feed Inductor", 2013 IEEE Energy Conversion Congress and Exposition, Oct. 28, 2013, total 8 pages.

* cited by examiner

WIRELESS CHARGER AND CONTROL METHOD

CROSS-REFERENCE TO RELATED APPLICATIONS

This application is a continuation of International Application No. PCT/CN2019/085946, filed on May 8, 2019, which claims priority to Chinese Patent Application No. 201810548622.6, filed on May 31, 2018. The disclosures of the aforementioned applications are hereby incorporated by reference in their entireties.

TECHNICAL FIELD

This application relates to the field of wireless charging, and in particular, to a wireless charger and a control method.

BACKGROUND

A wireless charging apparatus has advantages such as a small size, high portability, and a waterproof and dustproof design favorable to an electrical device. Currently, the wireless charging apparatus is widely applied to electronic devices such as a smartphone and a wearable device.

A class-E power amplifier is widely used in the field of wireless charging by virtue of an ideal work efficiency of 100%, a simple structure, and an easy implementation.

In actual use, when a load device changes in a location and a size, there are comparatively great changes in an actual output efficiency and an output power of the class-E power amplifier. When the output power changes within a comparatively great range, damage is caused to the load device, for example, a problem of accelerating battery aging may be caused.

SUMMARY

This application provides a wireless charger and a control method, to ensure efficient and stable output of a class-E power amplifier when a load changes.

According to a first aspect, an embodiment of this application provides a wireless charger, including a class-E power amplifier and a tunable impedance circuit that is connected to an output end of the class-E power amplifier. The class-E power amplifier includes a switching transistor and a tunable capacitance circuit that is parallelly connected to the switching transistor. The wireless charger further includes a control unit.

The control unit is configured to obtain a constraint condition of the class-E power amplifier. The constraint condition includes a target efficiency of the class-E power amplifier, a target output power of the class-E power amplifier, and a circuit parameter of the class-E power amplifier. The target efficiency is a preset minimum output efficiency of the class-E power amplifier, and the target output power is a preset constant output power of the class-E power amplifier.

The control unit is further configured to determine N1 target equivalent load impedances of the class-E power amplifier based on the constraint condition, where N1 is 1 or an integer greater than 1.

The control unit is further configured to adjust a capacitance value of the tunable capacitance circuit in the class-E power amplifier, and adjust an impedance value of the tunable impedance circuit, to enable an equivalent load impedance of the class-E power amplifier to match one of the N1 target equivalent load impedances.

According to the technical solution provided in this embodiment of this application, a plurality of target equivalent load impedances that meet the constraint condition are determined based on the constraint condition of the class-E power amplifier. Then the capacitance value of the tunable capacitance circuit in the class-E power amplifier is adjusted, and the impedance value of the tunable impedance circuit is adjusted, to match the equivalent load impedance of the class-E power amplifier with one target equivalent load impedance. According to the technical solution provided in this embodiment of this application, because the equivalent load impedance of the class-E power amplifier matches the target equivalent load impedance, even if a load changes, efficient and stable output of the class-E power amplifier can still be ensured.

In some embodiments of this application, the wireless charger may further include a storage unit. The storage unit is configured to prestore the constraint condition of the class-E power amplifier.

When configured to obtain the constraint condition of the class-E power amplifier, the control unit is configured to obtain the constraint condition of the class-E power amplifier from the storage unit.

In some embodiments of this application, the wireless charger further includes a communications unit.

The communications unit is configured to obtain the constraint condition of the class-E power amplifier by using a terminal that communicates with the communications unit.

When configured to obtain the constraint condition of the class-E power amplifier, the control unit is configured to obtain the constraint condition of the class-E power amplifier from the communications unit.

In some embodiments of this application, when configured to match the equivalent load impedance of the class-E power amplifier with one of the N1 target equivalent load impedances, the control unit is configured to enable the equivalent load impedance of the class-E power amplifier to be equal to one of the N1 target equivalent load impedances.

In some embodiments of this application, when configured to match the equivalent load impedance of the class-E power amplifier with one of the N1 target equivalent load impedances, the control unit is configured to enable the equivalent load impedance of the class-E power amplifier to be equal to a target equivalent load impedance of the N1 target equivalent load impedances that has a smallest modulus of a difference between the target equivalent load impedance and the equivalent load impedance of the class-E power amplifier.

In some embodiments of this application, when configured to determine the N1 target equivalent load impedances of the class-E power amplifier based on the constraint condition, the control unit is configured to: if the tunable capacitance circuit has N2 values obtainable through adjustment, each capacitance value obtainable through adjustment corresponds to one Smith chart, and each Smith chart corresponds to one target curve segment that meets the constraint condition, where N2 is an integer greater than or equal to 2, select N1 points from N2 target curve segments, and use a set of impedances corresponding to the N1 points as the N1 target equivalent load impedances of the class-E power amplifier.

According to a second aspect, an embodiment of this application provides a wireless charging control method, applied to a wireless charger that wirelessly charges a load device. The wireless charger includes a class-E power amplifier and a tunable impedance circuit that is connected to an output end of the class-E power amplifier. The class-E power amplifier includes a switching transistor and a tunable capacitance circuit that is parallelly connected to the switching transistor, and the method includes:

obtaining a constraint condition of the class-E power amplifier, where the constraint condition includes a target efficiency of the class-E power amplifier, a target output power of the class-E power amplifier, and a circuit parameter of the class-E power amplifier, where the target efficiency is a preset minimum output efficiency of the class-E power amplifier, and the target output power is a preset constant output power of the class-E power amplifier;

determining N1 target equivalent load impedances of the class-E power amplifier based on the constraint condition, where N1 is 1 or an integer greater than 1; and adjusting a capacitance value of the tunable capacitance circuit in the class-E power amplifier, and adjusting an impedance value of the tunable impedance circuit, to enable an equivalent load impedance of the class-E power amplifier to match one of the N1 target equivalent load impedances.

In some embodiments of this application, the obtaining a constraint condition of the class-E power amplifier includes:

obtaining the constraint condition of the class-E power amplifier from a storage unit that prestores the constraint condition; or obtaining the constraint condition of the class-E power amplifier by using a terminal that communicates with the wireless charger.

In some embodiments of this application, the enabling an equivalent load impedance of the class-E power amplifier to match one of the N1 target equivalent load impedances includes:

enabling the equivalent load impedance of the class-E power amplifier to be equal to one of the N1 target equivalent load impedances.

In some embodiments of this application, the enabling an equivalent load impedance of the class-E power amplifier to match one of the N1 target equivalent load impedances includes:

enabling the equivalent load impedance of the class-E power amplifier to be equal to a target equivalent load impedance of the N1 target equivalent load impedances that has a smallest modulus of a difference between the target equivalent load impedance and the equivalent load impedance of the class-E power amplifier.

In some embodiments of this application, the determining N1 target equivalent load impedances of the class-E power amplifier based on the constraint condition includes:

if the tunable capacitance circuit has N2 values obtainable through adjustment, each capacitance value obtainable through adjustment corresponds to one Smith chart, and each Smith chart corresponds to one target curve segment that meets the constraint condition, where N2 is an integer greater than or equal to 2, selecting N1 points from N2 target curve segments, and using a set of impedances corresponding to the N1 points as the N1 target equivalent load impedances of the class-E power amplifier.

According to a third aspect, an embodiment of this application provides a wireless charging system, including a load device and a wireless charger that wirelessly charges the load device. The wireless charger is the wireless charger according to any one of the first aspect or the possible implementations of the first aspect.

BRIEF DESCRIPTION OF DRAWINGS

To describe the technical solutions in the embodiments of this application clearly, the following briefly describes accompanying drawings required for describing the embodiments.

DESCRIPTION OF EMBODIMENTS

The following clearly describes the technical solutions in the embodiments of this application with reference to the accompanying drawings in the embodiments of this application.

A wireless charger in the embodiments of this application is applicable to various electronic devices with a wireless charging function, and particularly to some portable devices such as mobile phones, tablet computers, laptop computers, various wearable devices, and other terminal products. Such terminal products have a high requirement for mobility. Using the wireless charger can completely get rid of a constraint of a wire, and this helps improve mobility of the terminal products and improve user experience.

For ease of description, a charged electronic product below is referred to as a load device. A main innovation of the embodiments of this application lies in that a transmit end of a wireless charging system is referred to as a wireless charger.

Figure 1A:
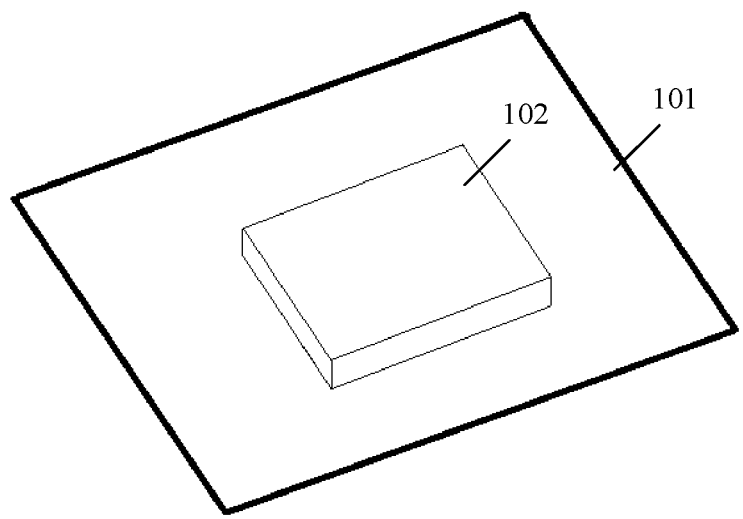
FIG. 1A is a schematic diagram of an application scenario of a wireless charging system according to an embodiment of this application.

As shown in FIG. 1A, the wireless charging system in the embodiments of this application includes a wireless charger 101 used as a transmit end and a load device 102 used as a receive end. The load device 102 receives energy from the wireless charger 101, to charge a battery of the load device 102 or directly supply power to the load device 102.

Figure 1B:
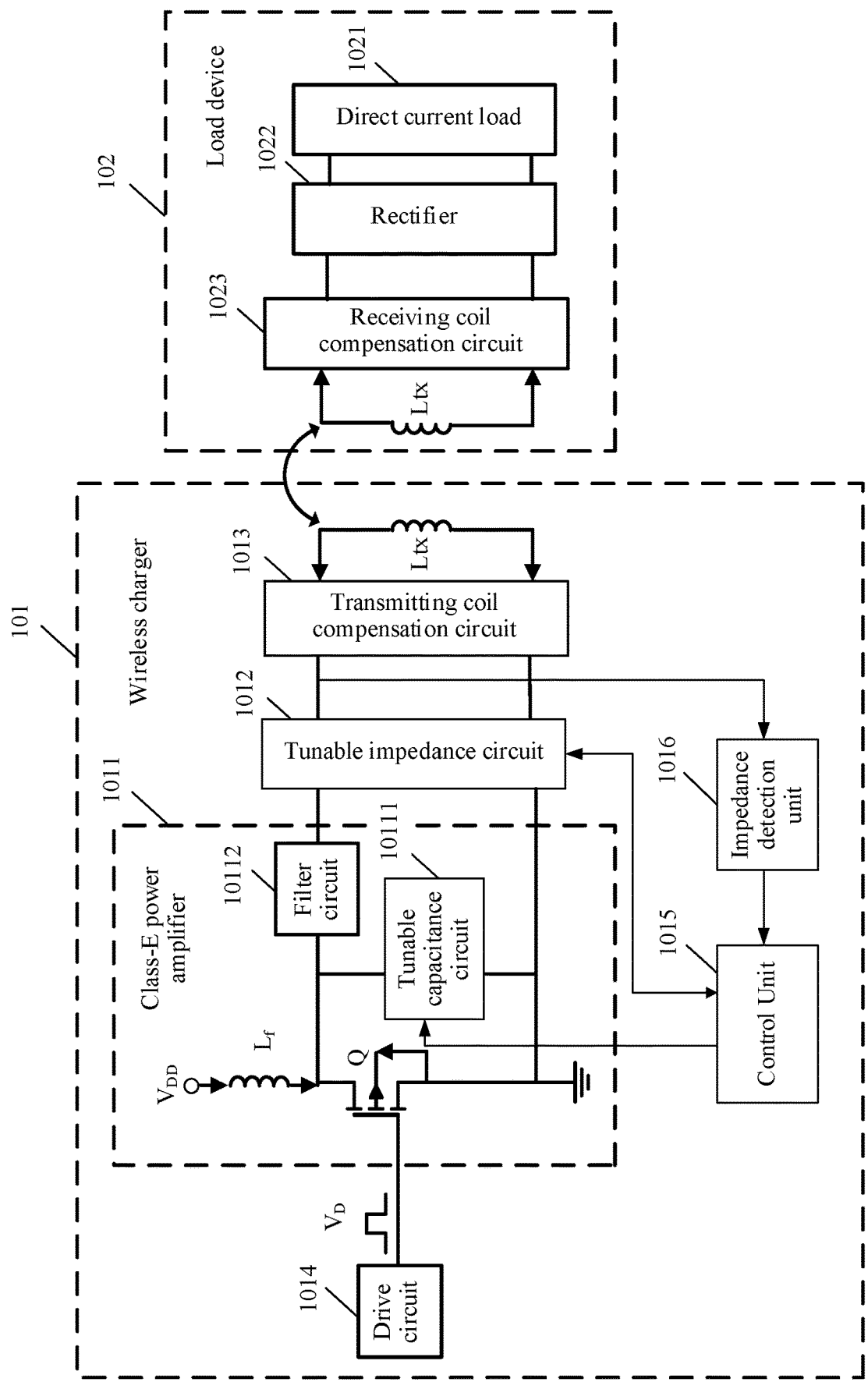
FIG. 1B is a schematic structural diagram of a wireless charging system according to an embodiment of this application.

FIG. 1B is a schematic structural diagram of a wireless charging system according to an embodiment of this application. The wireless charging system includes a wireless charger 101 and a load device 102.

The wireless charger 101 includes a class-E power amplifier 1011. The class-E power amplifier 1011 includes a switching transistor Q and a tunable capacitance circuit 10111 that is parallelly connected to the switching transistor Q. One end of the tunable capacitance circuit 10111 is connected to a drain of the switching transistor Q, and the other end of the tunable capacitance circuit 10111 is connected to a source of the switching transistor Q. A power supply $V_{DD}$ is connected to the drain of the switching transistor Q by using a radio frequency choke coil Lf, and an input end of a filter circuit 10112 is connected to the drain of the switching transistor Q. The wireless charger 101 further includes a drive circuit 1014 that provides a drive signal $V_D$ for the class-E power amplifier 1011, a tunable impedance circuit 1012 connected to an output end of the filter circuit 10112, a transmitting coil compensation circuit 1013 connected between a transmitting coil Ltx and the tunable impedance circuit 1012, an impedance detection unit 1016 connected to an input end of the transmitting coil compensation circuit 1013, and a control unit 1015 connected to the impedance detection unit 1016. The control unit 1015 is further connected to the tunable impedance circuit 1012 and the tunable capacitance circuit 10111. The load device 102 includes a receiving coil Lrx, a receiving coil replenishing circuit 1023, a rectifier 1022, and a direct current load 1021 that are sequentially connected.

The control unit 1015 in the wireless charger 101 is configured to obtain a constraint condition of the class-E power amplifier. The constraint condition includes a target efficiency of the class-E power amplifier 1011, a target output power of the class-E power amplifier 1011, and a circuit parameter of the class-E power amplifier 1011. The target efficiency is a preset minimum output efficiency of the class-E power amplifier 1011, and the target output power is a preset constant output power of the class-E power amplifier 1011. For example, the target efficiency may be 65%, 80%, 90%, or the like. The target output power may be 8 W, 9 W, 9.2 W, 10 W, or the like. Circuit parameters of the class-E power amplifier include an inductance value of the radio frequency choke coil Lf, a voltage value of the power supply $V_{DD}$, a parameter of the switching transistor Q, values of possible combinations of the tunable capacitance circuit, and parameter values of the filter circuit.

Figure 1C:
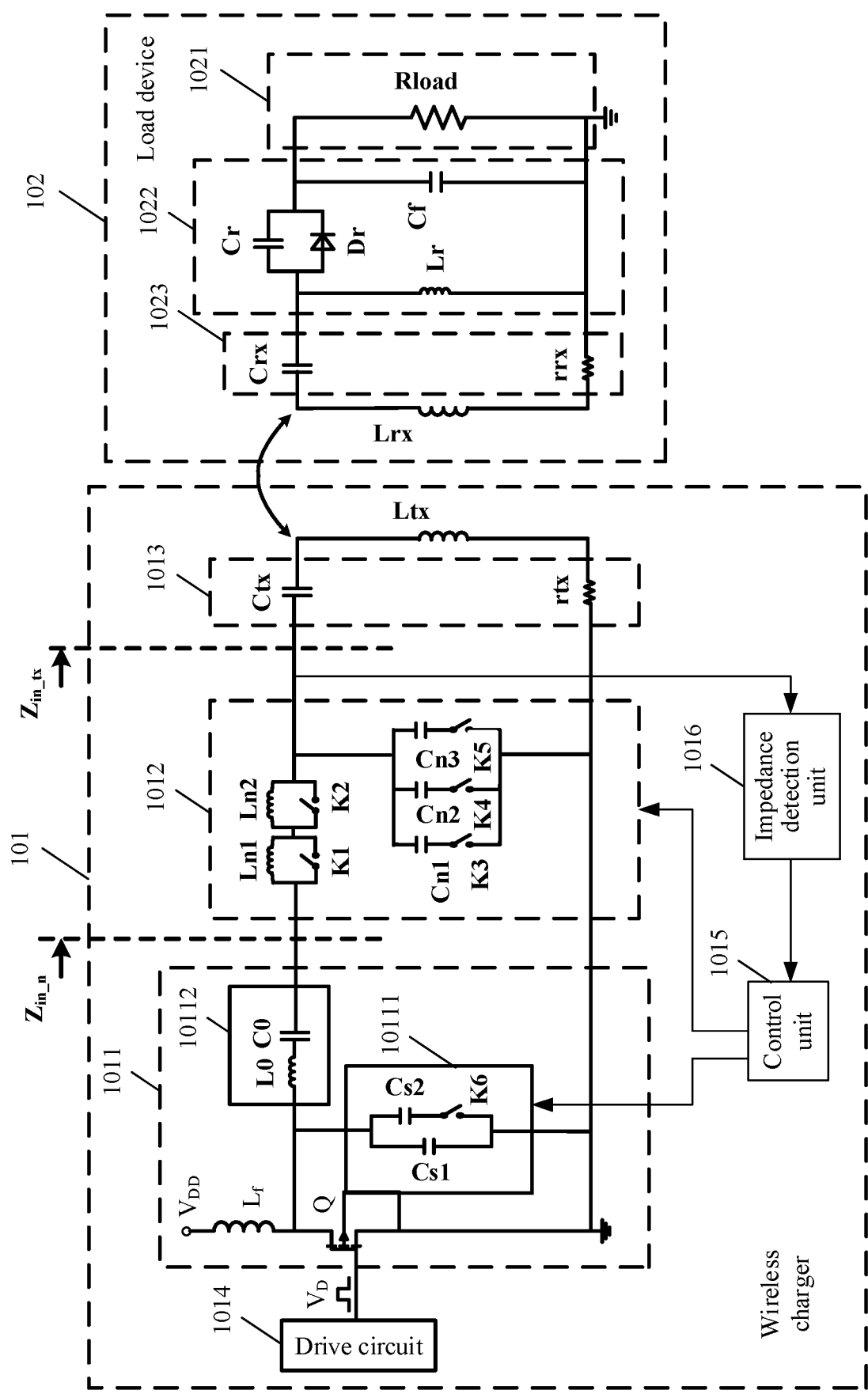
FIG. 1C is a schematic structural diagram of a specific circuit corresponding to FIG. 1B according to an embodiment of this application.

Using FIG. 1C as an example, there are two possible values of possible combinations of the tunable capacitance circuit in FIG. 1C. One value is a capacitance value Cs1 corresponding to a case in which a switch K6 is turned on, and the other value is a capacitance value Cs1+Cs2 corresponding to a case in which the switch K6 is turned off. The filter circuit 10112 includes an inductor L0 and a capacitor C0 that are serially connected. The parameter values of the filter circuit 10112 include an inductance value of the inductor L0 and a capacitance value of the capacitor C0.

In some embodiments of this application, the wireless charger 101 may further include a storage unit, configured to prestore the constraint condition. The control unit 1015 may obtain the prestored constraint condition from the storage unit. In another possible implementation of this application, the wireless charger 101 may include a communications unit, configured to obtain the constraint condition of the class-E power amplifier 1011 by using a terminal that communicates with the wireless charger 101. The control unit 1015 obtains the constraint condition of the class-E power amplifier 1011 by using the communications unit.

The control unit 1015 is further configured to determine N1 target equivalent load impedances of the class-E power amplifier 1011 that meet the constraint condition, where N1 is 1 or an integer greater than 1.

Figure 2:
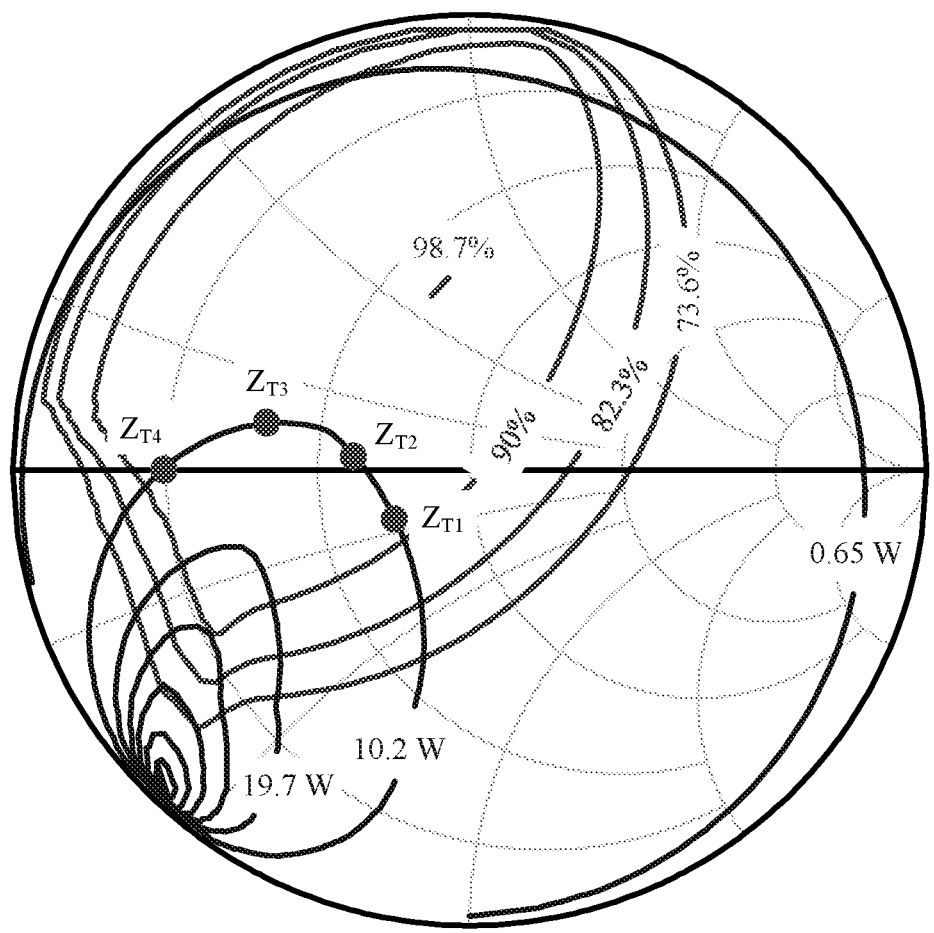
FIG. 2 is a schematic Smith chart corresponding to an embodiment of this application.
Figure 3:
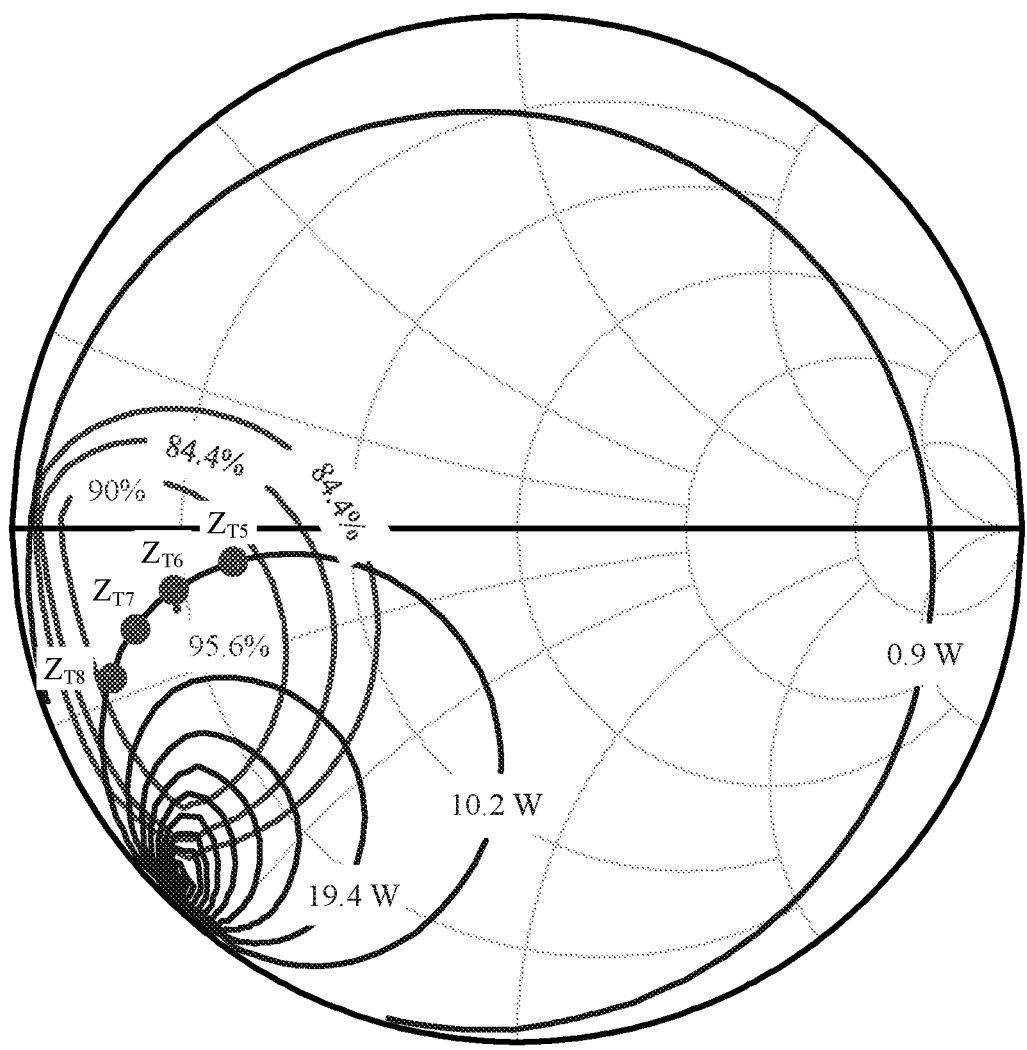
FIG. 3 is another schematic Smith chart corresponding to an embodiment of this application.

It should be noted that, if the tunable capacitance circuit 10111 has N2 values obtainable through adjustment, each capacitance value obtainable through adjustment corresponds to one Smith chart, and each Smith chart corresponds to one target curve segment that meets the constraint condition, where N2 is an integer greater than or equal to 2. Using FIG. 1C as an example, in this embodiment, N2=2, and this corresponds to two Smith charts as shown in FIG. 2 and FIG. 3. The target efficiency of the class-E power amplifier 1011 corresponding to FIG. 2 and FIG. 3 is 90%, and the target output power of the class-E power amplifier 1011 is 10.2 W. Each Smith chart corresponds to one target curve segment that meets the constraint condition, that is, a curve segment of a target power curve in an area corresponding to the target efficiency.

The control unit 1015 selects N1 points from N2 target curve segments, and uses a set of impedances corresponding to the N1 points as the N1 target equivalent load impedances of the class-E power amplifier 1011, where N1 may be a preset value. In the embodiment corresponding to FIG. 2 and FIG. 3, impedance values corresponding to four points are randomly selected from each target curve segment that meet the constraint condition as the target equivalent load impedances. It may be understood that, in some possible embodiments, the N1 target equivalent load impedances may include end values of impedances corresponding to target curve segments.

Randomly selecting four points from each target curve segment is used as an example for description. FIG. 2 is a Smith chart in a case in which the switch K6 in FIG. 1C is turned on, that is, the capacitance value of the tunable capacitance circuit is Cs1. The four points randomly selected are $Z_{T1}$, $Z_{T2}$, $Z_{T3}$, and $Z_{T4}$ in FIG. 2. FIG. 3 is a Smith chart in a case in which the switch K6 in FIG. 1C is turned off, that is, the capacitance value of the tunable capacitance circuit is Cs1+Cs2. The four points randomly selected are $Z_{T5}$, $Z_{T6}$, $Z_{T7}$, and $Z_{T8}$ in FIG. 3. Therefore, the target equivalent load impedances of the class-E power amplifier that meet the constraint condition include impedance values corresponding to $Z_{T1}$, $Z_{T2}$, $Z_{T3}$, $Z_{T4}$, $Z_{T5}$, $Z_{T6}$, $Z_{T7}$, and $Z_{T8}$.

The control unit 1015 is further configured to adjust the capacitance value of the tunable capacitance circuit 10111 in the class-E power amplifier 1011, and adjust an impedance value of the tunable impedance circuit 1012, to match an equivalent load impedance of the class-E power amplifier 1011 with one of the N1 target equivalent load impedances.

It should be noted that an adjustable parameter in the tunable impedance circuit 1012 may be a stepless adjustment parameter or a switch parameter.

Figure 4:
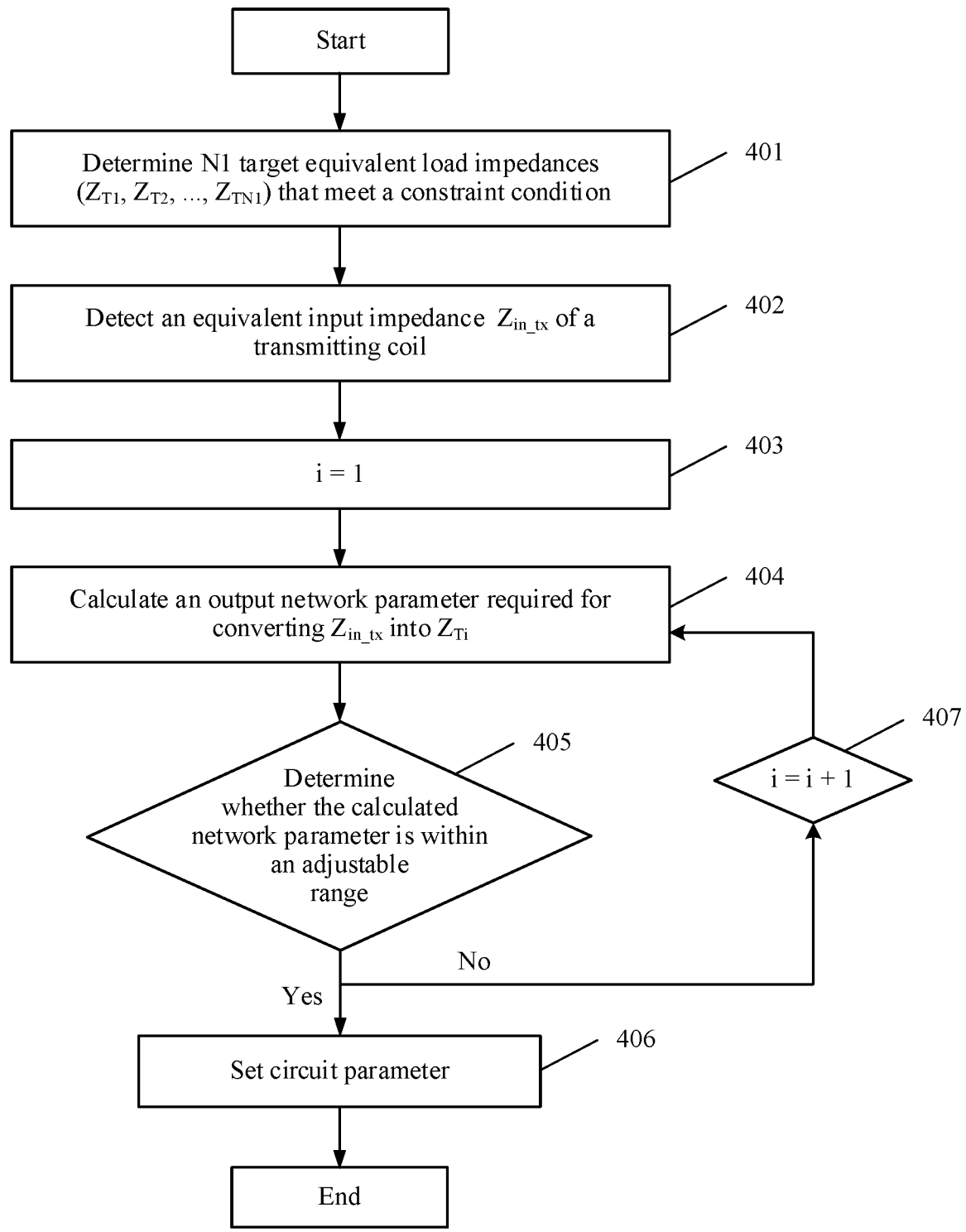
FIG. 4 is a schematic flowchart of a wireless charging control method according to an embodiment of this application.

For the stepless adjustment parameter, the equivalent load impedance of the class-E power amplifier 1011 may be adjusted to be equal to the target equivalent load impedance. For a processing procedure of the control unit 1015, refer to a schematic flowchart shown in FIG. 4. The processing procedure shown in FIG. 4 may include the following operations:

401. Determine N1 target equivalent load impedances ($Z_{T1}$, $Z_{T2}$, ..., $Z_{TN1}$) that meet a constraint condition.

Using FIG. 2 and FIG. 3 as examples, N1 is 8, and eight target equivalent load impedances that meet the constraint condition are $Z_{T1}$, $Z_{T2}$, $Z_{T3}$, $Z_{T4}$, $Z_{T5}$, $Z_{T6}$, $Z_{T7}$, and $Z_{T8}$.

402. Detect an equivalent input impedance $Z_{in\_tx}$ of a transmitting coil.

In some embodiments of this application, the equivalent input impedance $Z_{in\_tx}$ of the transmitting coil may be shown in FIG. 1C, and is obtained through detection by using the impedance detection unit 1016. A change of the load device 102 is reflected by using the equivalent input impedance $Z_{in\_tx}$ of the transmitting coil.

403. Set i=1.

404. Calculate an output network parameter required for converting $Z_{in\_tx}$ into $Z_{Ti}$.

405. Determine whether the calculated network parameter is within an adjustable range.

If a determining result of operation 405 indicates that the calculated network parameter is not within the adjustable range, perform operation 407 to set i=i+1, and then perform operation 404.

If a determining result of operation 405 indicates that the calculated network parameter is within the adjustable range, perform operation 406 to set a circuit parameter. By this, adjustment is completed.

Figure 5:
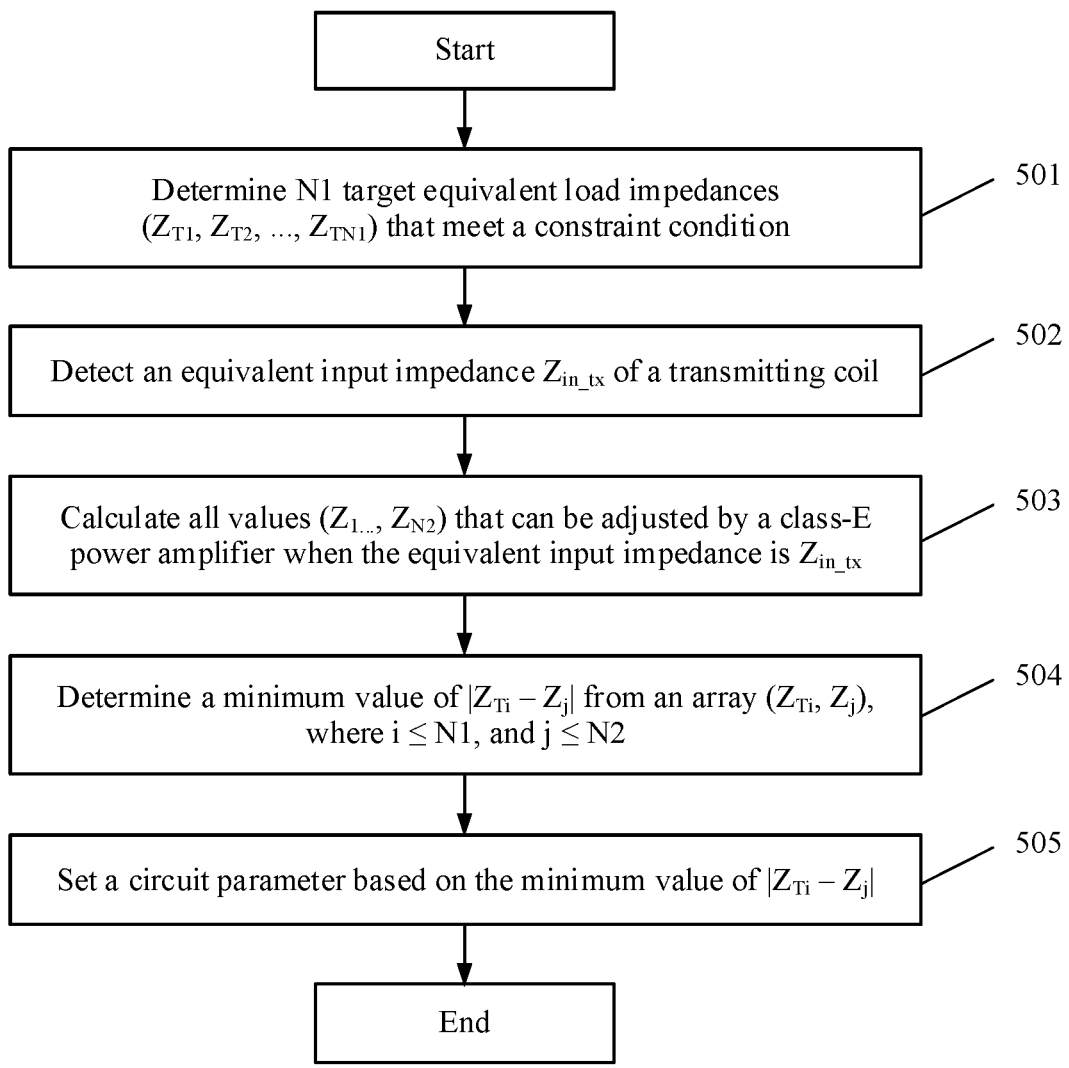
FIG. 5 is a schematic flowchart of a wireless charging control method according to an embodiment of this application.

In some embodiments of this application, changes of a capacitance and an impedance in the tunable capacitance circuit may be adjusted by using a switch. The target equivalent load impedance is obtained as follows: adjusting the tunable capacitance circuit in the class-E power amplifier, and adjusting an impedance value of a tunable impedance circuit, to match the equivalent load impedance of the class-E power amplifier with one of N1 target equivalent load impedances. For a processing procedure of the control unit, refer to a schematic flowchart shown in FIG. 5. The processing procedure shown in FIG. 5 includes the following operations:

501. Determine N1 target equivalent load impedances $(Z_{T1}, Z_{T2}, \ldots, Z_{TN1})$ that meet a constraint condition.

Using FIG. 2 and FIG. 3 as examples, N1 is 8, and eight target equivalent load impedances that meet the constraint condition are $Z_{T1}, Z_{T2}, Z_{T3}, Z_{T4}, Z_{T5}, Z_{T6}, Z_{T7},$ and $Z_{T8}$.

502. Detect an equivalent input impedance $Z_{in\_tx}$ of a transmitting coil.

In some embodiments of this application, the equivalent input impedance $Z_{in\_tx}$ of the transmitting coil may be shown in FIG. 1C, and is obtained through detection by using the impedance detection unit 1016. A change of the load device 102 is reflected by using the equivalent input impedance $Z_{in\_tx}$ of the transmitting coil.

503. Calculate all values $(Z_1, \ldots, Z_{N2})$ obtainable through adjustment by the class-E power amplifier when the equivalent input impedance is $Z_{in\_tx}$.

504. Determine a minimum value of $|Z_{Ti}-Z_j|$ from an array $(Z_{Ti}, Z_j)$, where i≤N1, and j≤N2.

505. Set a circuit parameter based on the minimum value of $|Z_{Ti}-Z_j|$.

By this, adjustment is completed.

A simulation test is performed to verify performance of this application. A structure of the wireless charger is shown in FIG. 1C, and a constraint condition includes that an output power of the class-E power amplifier is kept at approximately 9 W, and an efficiency is kept at 66% or above. An inductance value of the radio frequency choke coil Lf is 68 uH, a capacitance value of the capacitor Cs1 parallel with a switch is 215 pF, a capacitance value of the capacitor Cs2 parallel with the switch is 205 pF, an inductance value of the filter inductor L0 is 1.42 uH, a capacitance value of the filter capacitor C0 is 626 pF, and an inductance value of the transmitting coil Ltx is 3.24 uH, a parasitic resistance rtx of the transmitting coil is 0.7 ohm, a capacitance value of a compensation capacitor Ctx of the transmitting coil is 165 pF, an inductance value of the receiving coil Lrx is 3.24 uH, a resistance value of a parasitic resistor rrx of the receiving coil is 0.7 ohm, a capacitance value of a compensation capacitor Crx of the receiving coil is 175 pF, and a coefficient k of coupling between the transmitting coil and the receiving coil is from 0.1 to 0.4. The tunable impedance circuit is an L-shaped impedance matching network. An inductance value of a radio frequency inductor Ln1 is 400 nH, and an inductance value of a radio frequency inductor Ln2 is 600 nH. A capacitance value of a radio frequency capacitor Cn1 is 300 pF, a capacitance value of a radio frequency capacitor Cn2 is 450 pF, and a capacitance value of a radio frequency capacitor Cn3 is 600 pF. A capacitance value of the radio frequency choke coil Lr is 68 uH. A capacitance value of a capacitor Cr parallel with a diode Dr is 200 pF. A capacitance value of a direct current filter capacitor Cf is 44 uF.

After obtaining the constraint condition, the control unit 1015 determines that target equivalent load impedances that meet the constraint condition are: 6.6−3.4j, 11.3+0.8j, 19.5+4j, 28.7+0j, 34.4−5.3j, 3−9.8j, 8−4j, 16.3−1.5j, 24.4−2.7j, and 33−8.8j. The impedance detection unit 1016 detects an equivalent input impedance $Z_{in\_tx}$ of the transmitting coil, and then selects a group (Ln1, Ln2, Cn1, Cn2, Cn3, and Cs) of values based on an adjustable component. To be specific, switch states of switches (K1, K2, K3, K4, K5, and K6) are selected, to make a value of an input impedance Zinn in the circuit shown in FIG. 1C is closest to any value of the plurality of target equivalent load impedances, when a left side of the tunable impedance circuit is disconnected. Table 1 lists state values of the switches K1 to K6 under different operating conditions. 1 indicates that the switch is turned off, and 0 indicates that the switch is turned on. When the coil coupling coefficient k changes from 0.1 to 0.4, and a load Rload changes from 10 ohms to 100 ohms, an output power of the class-E power amplifier is kept at approximately 9 W, and an efficiency is greater than 66%.

TABLE 1

| | $R_{load}$ (Ω) | | | | | | | | | |
|---|---|---|---|---|---|---|---|---|---|---|
| k | 10 | 20 | 30 | 40 | 50 | 60 | 70 | 80 | 90 | 100 |
| 0.1 | 110000 | 111000 | 111100 | 110110 | 110110 | 111110 | 111110 | 111110 | 111110 | 111110 |
| 0.2 | 010100 | 011000 | 010100 | 010010 | 010010 | 011100 | 011010 | 011010 | 010110 | 010110 |
| 0.3 | 100101 | 100011 | 100011 | 101101 | 101101 | 101101 | 101011 | 101011 | 101011 | 101011 |
| 0.4 | 001001 | 000101 | 000101 | 000101 | 000101 | 000011 | 000011 | 000011 | 000011 | 000011 |

Figure 6A:
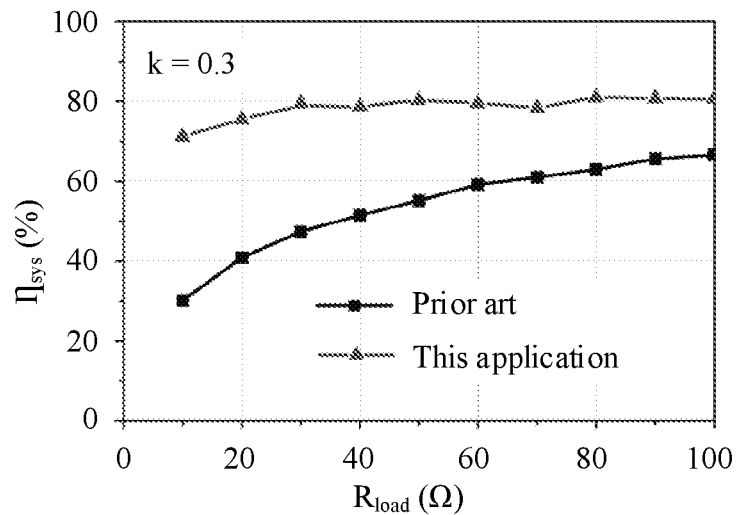
FIG. 6A is a schematic diagram of a characteristic comparison between a technical solution provided in this application and in the prior art.
Figure 6B:
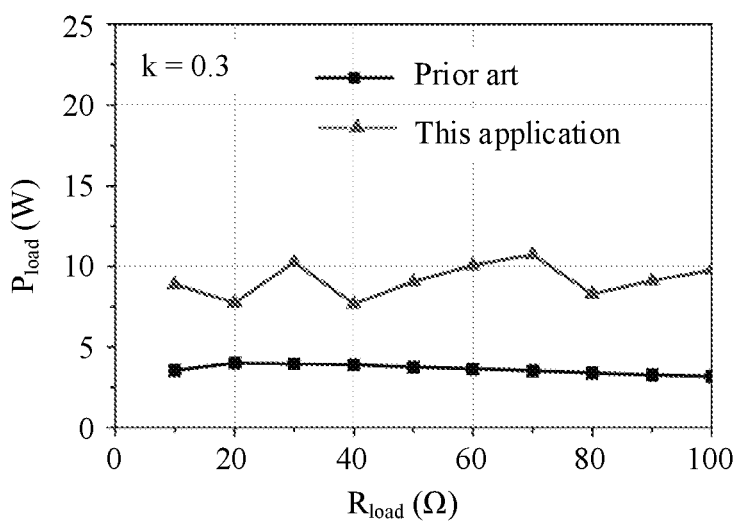
FIG. 6B is a schematic diagram of a characteristic comparison between a technical solution provided in this application and in the prior art.
Figure 7A:
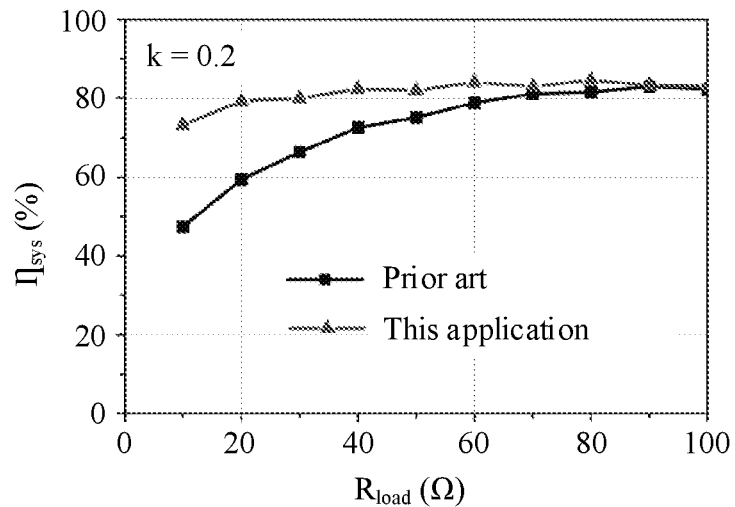
FIG. 7A is a schematic diagram of a characteristic comparison between a technical solution provided in this application and in the prior art.
Figure 7B:
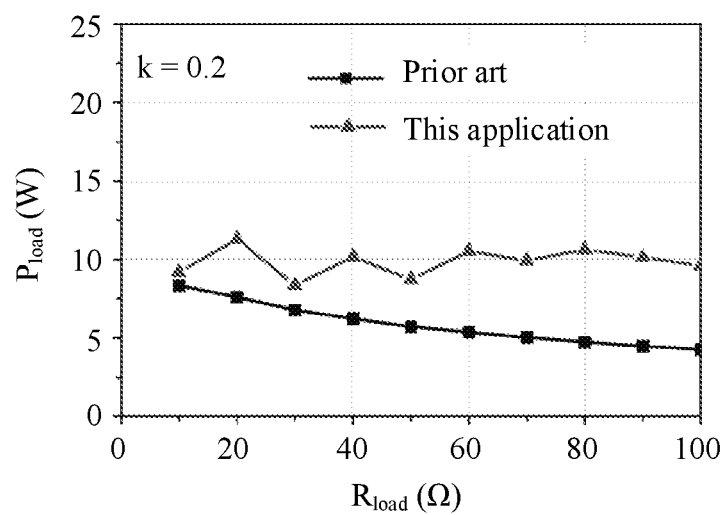
FIG. 7B is a schematic diagram of a characteristic comparison between a technical solution provided in this application and in the prior art.

FIG. 6A, FIG. 6B, FIG. 7A, and FIG. 7B are schematic diagrams of characteristic comparisons between a technical solution that is obtained by using a simulation test and that is provided in this application and in the prior art. A circuit structure in the technical solution provided in this application is shown in FIG. 1C. In comparison with FIG. 1C, a circuit structure in the prior art includes no tunable impedance circuit 1012, no switch K6, and no switch Cs2. Other circuit structures and parameters are the same as those in FIG. 1B. A coupling coefficient k corresponding to FIG. 6A and FIG. 6B is 0.3. A coupling coefficient k corresponding to FIG. 7A and FIG. 7B is 0.2. FIG. 6A and FIG. 7A are schematic diagrams of corresponding output efficiency characteristic curves, and FIG. 6B and FIG. 7B are schematic diagrams of corresponding output power characteristic curves. It can be learned from observation that, in the technical solution in the prior art, an output is unstable in a case of changes of a wide coupling range and a wide load range, and an efficiency drops to a quite low value in some cases. This test also verifies advantages, of the technical solution provided in this application, that an efficient and stable output in the case of changes of the wide load range and the wide coupling range can be achieved by using the technical solution provided in this application.

An embodiment of this application further provides a wireless charging system, including a load device and a wireless charger that wirelessly charges the load device. The wireless charger may be the wireless charger described in any one of the foregoing embodiments. Details are not described herein again.

A person of ordinary skill in the art may understand that all or some of the processes of the methods in the embodiments may be implemented by a computer program instructing relevant hardware. The program may be stored in a computer readable storage medium. When the program runs, the processes of the methods in the embodiments are included. What is disclosed above is merely embodiments of this application, and certainly is not intended to limit the protection scope of this application. Therefore, equivalent variations made in accordance with the claims of this application shall fall within the scope of this application.

What is claimed is:

1. A wireless charger, comprising
   a class-E power amplifier comprising a switching transistor and a tunable capacitance circuit that is parallelly connected to the switching transistor;
   a tunable impedance circuit that is connected to an output end of the class-E power amplifier; and
   a control unit configured to
      obtain a constraint condition of the class-E power amplifier, wherein the constraint condition comprises a target efficiency of the class-E power amplifier, a target output power of the class-E power amplifier, and a circuit parameter of the class-E power amplifier, wherein the target efficiency is a preset minimum output efficiency of the class-E power amplifier, and wherein the target output power is a preset constant output power of the class-E power amplifier,
      determine N1 target equivalent load impedances of the class-E power amplifier based on the constraint condition, wherein N1 is 1 or an integer greater than 1, and
      adjust a capacitance value of the tunable capacitance circuit in the class-E power amplifier, and adjust an impedance value of the tunable impedance circuit, to enable an equivalent load impedance of the class-E power amplifier to match one of the N1 target equivalent load impedances.

2. The wireless charger according to claim 1, wherein the wireless charger further comprises a storage unit
   to prestore the constraint condition of the class-E power amplifier; and
   wherein when configured to obtain the constraint condition of the class-E power amplifier, the control unit is configured to obtain the constraint condition of the class-E power amplifier from the storage unit.

3. The wireless charger according to claim 1, wherein the wireless charger further comprises a communications unit
   to obtain the constraint condition of the class-E power amplifier by using a terminal that communicates with the communications unit,
   wherein when configured to obtain the constraint condition of the class-E power amplifier, the control unit is configured to obtain the constraint condition of the class-E power amplifier from the communications unit.

4. The wireless charger according to claim 1, wherein when configured to match the equivalent load impedance of the class-E power amplifier with the one of the N1 target equivalent load impedances, the control unit is configured to enable the equivalent load impedance of the class-E power amplifier to be equal to the one of the N1 target equivalent load impedances.

5. The wireless charger according to claim 1, wherein when configured to match the equivalent load impedance of the class-E power amplifier with the one of the N1 target equivalent load impedances, the control unit is configured to enable the equivalent load impedance of the class-E power amplifier to be equal to a target equivalent load impedance of the N1 target equivalent load impedances that has a smallest modulus of a difference between the target equivalent load impedance and the equivalent load impedance of the class-E power amplifier.

6. The wireless charger according to claim 1, wherein when configured to determine the N1 target equivalent load impedances of the class-E power amplifier based on the constraint condition, the control unit is configured to: if the tunable capacitance circuit has N2 values obtainable through adjustment, each capacitance value obtainable through adjustment corresponds to one Smith chart, and each Smith chart corresponds to one target curve segment that meets the constraint condition, wherein N2 is an integer greater than or equal to 2, select N1 points from N2 target curve segments, and use a set of impedances corresponding to the N1 points as the N1 target equivalent load impedances of the class-E power amplifier.

7. A wireless charging control method comprising:
   obtaining a constraint condition of a class-E power amplifier of a wireless charger that wirelessly charges a load device, wherein the wireless charger comprises the class-E power amplifier and a tunable impedance circuit that is connected to an output end of the class-E power amplifier, wherein the class-E power amplifier comprises a switching transistor and a tunable capacitance circuit that is connected in parallel to the switching transistor, wherein the constraint condition comprises a target efficiency of the class-E power amplifier, a target output power of the class-E power amplifier, and a circuit parameter of the class-E power amplifier, wherein the target efficiency is a preset minimum output efficiency of the class-E power amplifier, and wherein the target output power is a preset constant output power of the class-E power amplifier;
   determining N1 target equivalent load impedances of the class-E power amplifier based on the constraint condition, wherein N1 is 1 or an integer greater than 1; and
   adjusting a capacitance value of the tunable capacitance circuit in the class-E power amplifier, and adjusting an impedance value of the tunable impedance circuit, to enable an equivalent load impedance of the class-E power amplifier to match one of the N1 target equivalent load impedances.

8. The method according to claim 7, wherein the obtaining the constraint condition of the class-E power amplifier comprises:
obtaining the constraint condition of the class-E power amplifier from a storage unit that prestores the constraint condition; or
obtaining the constraint condition of the class-E power amplifier by using a terminal that communicates with the wireless charger.

9. The method according to claim 7, wherein the enabling the equivalent load impedance of the class-E power amplifier to match the one of the N1 target equivalent load impedances comprises:
enabling the equivalent load impedance of the class-E power amplifier to be equal to the one of the N1 target equivalent load impedances.

10. The method according to claim 7, wherein the enabling the equivalent load impedance of the class-E power amplifier to match the one of the N1 target equivalent load impedances comprises:
enabling the equivalent load impedance of the class-E power amplifier to be equal to a target equivalent load impedance of the N1 target equivalent load impedances that has a smallest modulus of a difference between the target equivalent load impedance and the equivalent load impedance of the class-E power amplifier.

11. The method according to claim 7, wherein the determining N1 target equivalent load impedances of the class-E power amplifier based on the constraint condition comprises:
if the tunable capacitance circuit has N2 values obtainable through adjustment, each capacitance value obtainable through adjustment corresponds to one Smith chart, and each Smith chart corresponds to one target curve segment that meets the constraint condition, wherein N2 is an integer greater than or equal to 2,
selecting N1 points from N2 target curve segments, and using a set of impedances corresponding to the N1 points as the N1 target equivalent load impedances of the class-E power amplifier.

12. A wireless charging system, comprising
a load device; and
a wireless charger that wirelessly charges the load device, wherein the wireless charger comprises
a class-E power amplifier comprising a switching transistor and a tunable capacitance circuit that is parallelly connected to the switching transistor,
a tunable impedance circuit that is connected to an output end of the class-E power amplifier; and
a control unit configured to
obtain a constraint condition of the class-E power amplifier, wherein the constraint condition comprises a target efficiency of the class-E power amplifier, a target output power of the class-E power amplifier, and a circuit parameter of the class-E power amplifier, wherein the target efficiency is a preset minimum output efficiency of the class-E power amplifier, and wherein the target output power is a preset constant output power of the class-E power amplifier,
determine N1 target equivalent load impedances of the class-E power amplifier based on the constraint condition, wherein N1 is 1 or an integer greater than 1, and
adjust a capacitance value of the tunable capacitance circuit in the class-E power amplifier, and adjust an impedance value of the tunable impedance circuit, to enable an equivalent load impedance of the class-E power amplifier to match one of the N1 target equivalent load impedances.

13. The wireless charging system according to claim 12, wherein the wireless charger further comprises a storage unit
to prestore the constraint condition of the class-E power amplifier,
wherein when configured to obtain the constraint condition of the class-E power amplifier, the control unit is configured to obtain the constraint condition of the class-E power amplifier from the storage unit.

14. The wireless charging system according to claim 12, wherein the wireless charger further comprises a communications unit
to obtain the constraint condition of the class-E power amplifier by using a terminal that communicates with the communications unit,
wherein when configured to obtain the constraint condition of the class-E power amplifier, the control unit is configured to obtain the constraint condition of the class-E power amplifier from the communications unit.

15. The wireless charging system according to claim 12, when configured to match the equivalent load impedance of the class-E power amplifier with the one of the N1 target equivalent load impedances, the control unit is configured to enable the equivalent load impedance of the class-E power amplifier to be equal to the one of the N1 target equivalent load impedances.

16. The wireless charging system according to claim 12, wherein when configured to match the equivalent load impedance of the class-E power amplifier with the one of the N1 target equivalent load impedances, the control unit is configured to enable the equivalent load impedance of the class-E power amplifier to be equal to a target equivalent load impedance of the N1 target equivalent load impedances that has a smallest modulus of a difference between the target equivalent load impedance and the equivalent load impedance of the class-E power amplifier.

17. The wireless charging system according to claim 12, wherein when configured to determine the N1 target equivalent load impedances of the class-E power amplifier based on the constraint condition, the control unit is configured to:
if the tunable capacitance circuit has N2 values obtainable through adjustment, each capacitance value obtainable through adjustment corresponds to one Smith chart, and each Smith chart corresponds to one target curve segment that meets the constraint condition, wherein N2 is an integer greater than or equal to 2, select N1 points from N2 target curve segments, and use a set of impedances corresponding to the N1 points as the N1 target equivalent load impedances of the class-E power amplifier.

* * * * *